US007342710B2

(12) United States Patent
Kim et al.

(10) Patent No.: US 7,342,710 B2
(45) Date of Patent: Mar. 11, 2008

(54) MEMS SWITCH AND METHOD OF FABRICATING THE SAME

(75) Inventors: Che-heung Kim, Yongin-si (KR); Hyung-jae Shin, Seongnam-si (KR); Soon-cheol Kweon, Seoul (KR); Kyu-sik Kim, Suwon-si (KR); Sang-hun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/806,143

(22) Filed: May 30, 2007

(65) Prior Publication Data

US 2007/0227863 A1 Oct. 4, 2007

Related U.S. Application Data

(62) Division of application No. 11/258,196, filed on Oct. 26, 2005, now Pat. No. 7,251,069.

(30) Foreign Application Priority Data

Dec. 17, 2004 (KR) ............................ 2004-107858

(51) Int. Cl.
*G02B 26/00* (2006.01)
*H01L 21/00* (2006.01)

(52) U.S. Cl. ........................................ 359/290; 438/52

(58) Field of Classification Search ................ 359/225, 359/290; 438/48, 52
See application file for complete search history.

(56) References Cited

U.S. PATENT DOCUMENTS

| | | | | |
|---|---|---|---|---|
| 6,307,169 | B1 | 10/2001 | Sun et al. | |
| 6,830,701 | B2 * | 12/2004 | DeBar et al. | 216/27 |
| 6,917,086 | B2 * | 7/2005 | Cunningham et al. | 257/415 |
| 7,049,904 | B2 | 5/2006 | Shin | |

FOREIGN PATENT DOCUMENTS

| | | |
|---|---|---|
| JP | 2001-143595 A | 5/2001 |

* cited by examiner

*Primary Examiner*—Ricky Mack
*Assistant Examiner*—William C Choi
(74) *Attorney, Agent, or Firm*—Sughrue Mion, PLLC

(57) ABSTRACT

A micro electro mechanical system switch and a method of fabricating the same. The micro electro mechanical system switch includes a substrate a plurality of signal lines formed at sides an upper surface of the substrate and including switching contact points and a plurality of immovable electrodes on the upper surface of the substrate and between the plurality of signal lines. An inner actuating member performs a seesaw based on a center of the substrate and together with an outer actuating member. Pushing rods are formed at ends of an upper surface of the inner actuating member with ends protruding from and overlapping with an upper portion of the outer actuating member. Contacting members are formed on a lower surface of the outer actuating member so as to be pushed by the pushing rods and contacting the switching contact points of the signal lines.

11 Claims, 6 Drawing Sheets

MEMS SWITCH AND METHOD OF FABRICATING THE SAME

CROSS-REFERENCE TO RELATED APPLICATIONS

This is a divisional of application Ser. No. 11/258,196 filed Oct. 26, 2005 now U.S. Pat. No. 7,251,069. The entire disclosure of the prior application, application Ser. No. 11/258,196 is considered part of the disclosure of the accompanying divisional application and is hereby incorporated by reference.

This application claims the benefit of Korean Patent Application No. 2004-107858, filed on Dec. 17, 2004, in the Korean Intellectual Property Office, the disclosure of which is incorporated herein by reference.

BACKGROUND OF THE INVENTION

1. Field of the Invention

The present invention relates to a Micro Electro Mechanical System (MEMS) switch and a method of fabricating the same.

2. Description of the Related Art

RF switches of radio frequency (RF) devices using MEMS technology are widely manufactured. The RF switches are devices mainly applied to circuits selecting and transmitting signals and matching impedances in wireless telecommunication terminals and systems in a micro wave band or a millimeter wave band.

U.S. Pat. No. 6,307,169 (inventor: Sun et al.) discloses such a MEMS switch.

The disclosed MEMS switch includes a hinge supporting a membrane type electrode on a substrate. The hinge includes a control electrode connected to the substrate by an anchor, a hinge collar, and a hinge arm set. The control electrode includes a shorting bar that can be separated from and/or connected to the control electrode. In addition, a travel stop is provided between the substrate and the control electrode to prevent a stiction from occurring.

Japanese Publication Pat. No. hei 2001-143595 (inventor: TSUI KUINGU SAN) discloses another example of a MEMS switch.

The disclosed MEMS switch uses a micro plate frame structure suspended on a spring suspension system and formed on a substrate. The spring suspension system includes an end to which an anchor is adhered and extends substantially orthogonally to a signal line. The micro plate frame includes a short piece opposite to a gap in the signal line, and an electric contact point post is formed on the signal line to form a condenser structure. A selected voltage is applied to the condenser structure so that the condenser structure is pulled toward a lower electrode due to a static electricity.

An MEMS switch as described above uses an electrostatic force. Thus, a drive voltage is great and a stiction phenomenon occurs. In the stiction phenomenon, an unintentional adhesion occurs on a surface of a micro structure, and thus a restoration force fails to overcome a force working on a surface such as a capillary force, a Van der Walls force, an electrostatic force, or the like. As a result, the adhesion permanently occurs.

Also, in a case where contact states of the shorting bar disclosed in U.S. Pat. No. 6,307,169 and the short piece disclosed in Japanese Patent Publication No. hei 2001-143595 are poor, signals are not smoothly transmitted, and an insertion loss occurs.

SUMMARY OF THE INVENTION

Accordingly, the present general inventive concept has been made to solve the above-mentioned problems, and an aspect of the present general inventive concept is to provide a MEMS switch which can reduce a stiction fail and an insertion loss and be driven at a low voltage.

Another aspect of the present general inventive concept is to provide a method of fabricating the MEMS switch.

According to an aspect of the present invention, there is provided a micro electro mechanical system switch including: a substrate; a plurality of signal lines formed at both sides of an upper surface of the substrate and including switching contact points; a plurality of immovable electrodes on the upper surface of the substrate and between the plurality of signal lines; an inner actuating member performing a seesaw based on a center of the substrate; an outer actuating member performing a seesaw together with the seesaw of the inner actuating member; pushing rods formed at both ends of an upper surface of the inner actuating member and comprising ends protruding from an upper portion of the outer actuating member so as to overlap with the upper portion of the outer actuating member; and contacting members formed on a lower surface of the outer actuating member so as to be pushed by the pushing rods and contacting the switching contact points of the signal lines.

The outer actuating member may enclose the inner actuating member to keep a predetermined gap from an outer side of the inner actuating member.

The seesaw of the inner actuating member may be performed via a first anchor formed in a center of the substrate and a first spring arm formed at both sides of a central portion of the inner actuating member to be supported by the first anchor, and the seesaw of the outer actuating member may be performed via second anchors formed at both sides of a central portion of the substrate and second spring arms formed at an outer side of a central portion of the outer actuating member to be supported by the second anchors.

Upper surfaces of the inner and outer actuating members may be on an identical plane, and the pushing rods may be formed so as to keep predetermined distances from the upper surfaces of the inner and outer actuating members.

The contacting members may be formed of a conductive metal. The conductive metal may be gold (Au).

The inner and outer actuating members may be formed of metal layers, and an insulating layer may be formed on the immovable electrodes;

The inner and outer actuating members may be formed of first insulating layers and metal layers.

The inner and outer actuating members may be formed of first insulating layers, metal layers, and second insulating layers.

The pushing rods may be formed of an insulating material.

The second spring arms may be stiffer than the first spring arm.

Widths of the second spring arms may be greater than a width of the first spring arm so as to increase the stiffness of the second spring arms.

The first anchor may be formed on an identical axis line to the second anchors.

According to another aspect of the present invention, there is provided a method of fabricating a micro electro mechanical system switch, including: depositing a metal layer on a substrate and patterning signal lines including switching contact points and immovable electrodes; depositing a sacrificial layer on the signal lines and the immovable electrodes; depositing a second sacrificial on the first sacrificial layer and forming predetermined contacting member holes in positions facing the switching contact points; depositing a contacting member layer on the second sacrificial layer and leaving portions of the contacting member layer buried in the contacting member holes to pattern contacting members; depositing an actuating member layer on an upper surface of the contacting member layer on which the contacting members are formed and patterning inner and outer actuating members; depositing a third sacrificial layer on the second sacrificial layer on which the inner and outer actuating members are formed and patterning gap forming parts forming gaps of pushing rods; depositing a fourth sacrificial layer on the third sacrificial layer and patterning pushing rod support holes; depositing a pushing rod layer on the fourth sacrificial layer and patterning the pushing rods; and removing the first, second, third, and fourth sacrificial layers.

Before depositing the first sacrificial layer on the signal lines and the immovable electrodes, an insulating layer may be formed on the immovable electrodes to insulate a metal layer from the immovable electrodes. Here, the actuating member layer may be deposited using the metal layer.

The actuating member layer may be deposited by sequentially stacking a first insulating layer and a metal layer.

The actuating member layer may be deposited by sequentially stacking a first insulating layer, a metal layer, and a second insulating layer.

Depositing the metal layer on the substrate and patterning the signal lines comprising the switching contact points and the immovable electrodes includes: patterning a first anchor supporting the inner actuating member so that the inner actuating member performs a seesaw and second anchors supporting the outer actuating member so that the outer actuating member performs a seesaw.

The first anchor may be formed on an identical axis line to second anchors so as to keep predetermined gaps from the second anchors.

Patterning the inner and outer actuating members include: forming a first spring arm extending at the first anchor from both ends of a central portion of the inner actuating member; and forming second spring arms extending at the second anchors from both ends of a central portion of the outer actuating member.

The second spring arms may be stiffer than the first spring arm. Widths of the second spring arms may be greater than a width of the first spring arms so as to increase the stiffness of the second spring arms.

The pushing rod layer may be formed of an insulating material.

The contacting members may be formed of gold (Au).

BRIEF DESCRIPTION OF THE DRAWINGS

The above aspects and features of the present invention will be more apparent by describing exemplary embodiments of the present invention with reference to the accompanying drawings, in which.

DETAILED DESCRIPTION OF THE ILLUSTRATIVE NON-LIMITING EMBODIMENTS

Figure 1:
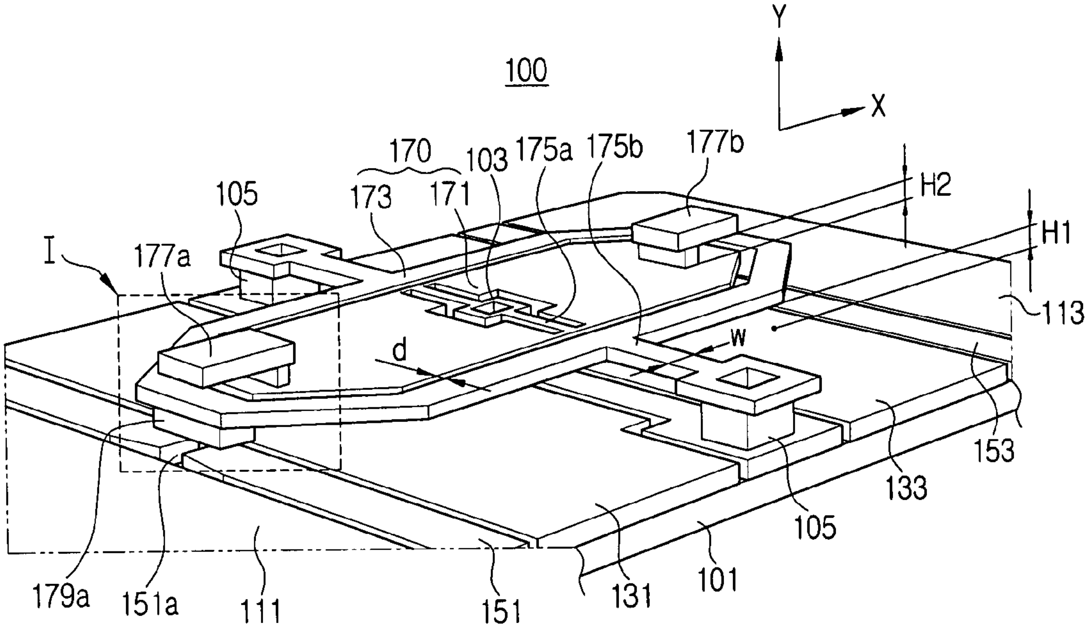
FIG. 1 is a schematic perspective view of an MEMS switch according to an exemplary embodiment of the present invention.

Exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

A MEMS switch shown in the drawings is magnified. In particular, direction Y is exaggerated for description convenience.

Figure 2:
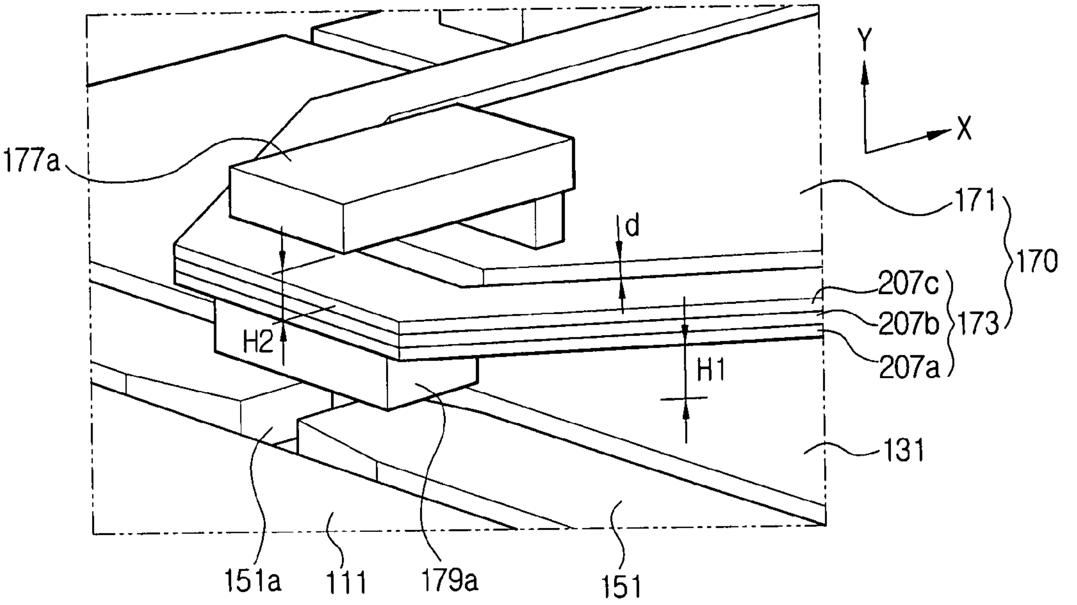
FIG. 2 is an enlarged view of portion I shown in FIG. 1.
Figure 3:
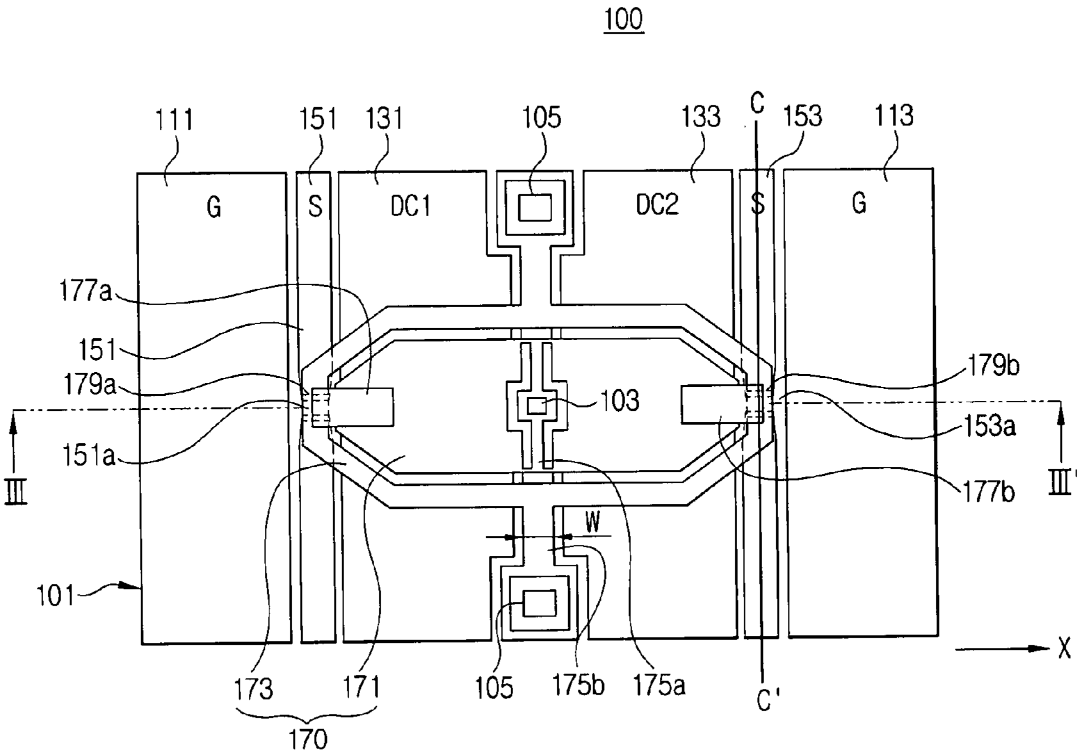
FIG. 3 is a plan view of the MEMS switch shown in FIG. 1.

FIG. 1 is a schematic perspective view of an MEMS switch according to an exemplary embodiment of the present invention, FIG. 2 is an enlarged view of portion I shown in FIG. 1, and FIG. 3 is a plan view of the MEMS switch shown in FIG. 1.

Referring to FIGS. 1 through 3, first and second ground electrodes 111 and 113, first and second immovable electrodes 131 and 133, and first and second signal lines 151 and 153 are formed on a substrate 101 so as to keep predetermined gaps. The first and second signal lines 151 and 153 include first and second switching contacting parts 151*a* and 153*a* formed to keep a predetermined gap. The substrate 101 may be a high resistance substrate, for example, a silicon wafer or the like, and the first and second ground electrodes 111 and 113, the first and second immovable electrodes 131 and 133, and the first and second signal lines 151 and 153 are formed of conductive metal layers, fore example, gold (Au).

A first anchor 103 is provided in the center of the substrate 101, and second anchors 105 are provided beside both sides of the first anchor 103 on the same axis line.

An actuating member 170 includes inner and outer actuating members 171 and 173. The inner actuating member 171 takes charge of a drive function, and the outer actuating member 173 takes charge of a switch contact function. The outer actuating member 173 performs a seesaw together with a seesaw of the inner actuating member 171.

In more detail, the inner actuating member 171 is installed so as to keep a predetermined a gap H1 from the substrate 101 and to perform the seesaw via the first anchor 103 and a first spring arm 175*a*. In other words, a central portion of the first spring arm 175*a* is supported by the first anchor 103 and extends from both sides of the inner actuating member 171 toward the first anchor 103. Here, the inner actuating member 171 has a flat plate shape, which becomes narrower toward the both ends, and first and second pushing rods 177*a* and 177*b* of cantilever type are provided at the both ends of the inner actuating member 171.

Here, the first and second pushing rods 177*a* and 177*b* are formed so as to keep a predetermined height H2 from an upper surface of the inner actuating member 171 and protrude from the both ends of the inner actuating member 171 so as to overlap with an upper surface of the outer actuating member 173. The first and second pushing rods 177*a* and 177*b* are formed of an insulating material. Here, the first and second pushing rods 177*a* and 177*b* are formed shortly and thickly, and thus their deformations are minimized. Thus, the first and second pushing rods 177*a* and 177*b* efficiently push a contact point of the outer actuating member 173. As a result, contacting forces of first and second contacting members 179*a* and 179*b* that will be described later can be improved.

The outer actuating member 173 performs the seesaw due to the contacting forces of the first and second pushing rods 177*a* and 177*b* when the inner actuating member 171 performs the seesaw. The outer actuating member 173 also has a shape corresponding to an outer line of the inner actuating member 171, i.e., a ring shape, so as to enclose the inner actuating member 171. Here, the outer actuating member 173 keeps a minute distance d from the inner actuating member 171, and an upper surface thereof is on the same plane as an upper surface of the inner actuating member 171.

Second spring arms 175*b* extend from both sides of a central portion of the outer actuating member 173 and are supported by the second anchors 105 so that the outer actuating member 173 performs the seesaw. Here, the second spring arms 175*b* may be thicker or wider than the first spring arm 175*a* so as to be stiffer than the first spring arm 175*a*. As shown in FIG. 3, the second spring arms 175*b* are formed so as to have the same thickness as the first spring arm 175*a*, and widths W of the second spring arms 175*b* are relatively increased.

Figure 4A:
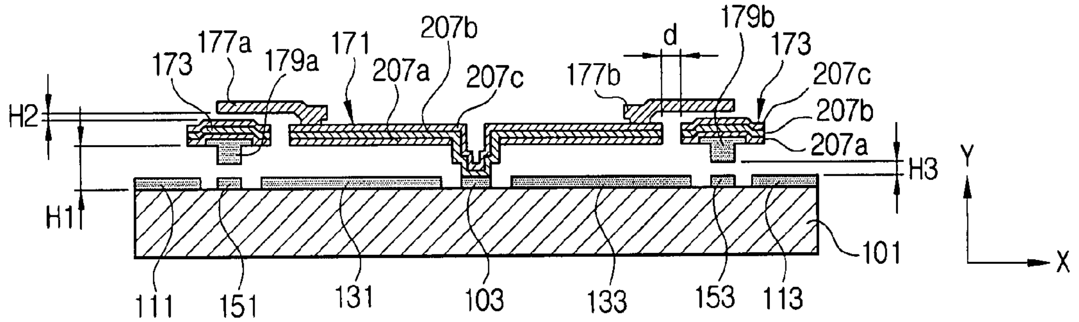
FIGS. 4A through 4C are cross-sectional views taken along line III-III' shown in FIG. 3 to illustrate an operation of the MEMS switch shown in FIG. 1.

Each of the inner and outer actuating members 171 and 173 includes three layers, i.e., a first insulating layer 207*a*, a metal layer 207*b*, and a second insulating layer 207*c* referring to FIG. 4A. Thus, the constitution of the three layers can contribute to a reduction in a thermal deformation. Here, the inner and outer actuating members 171 and 173 are formed of the same layer and then separated from each other by a patterning work. Layers of the inner and outer actuating members 171 and 173 are denoted by like reference numerals. The layer structures of the inner and outer actuating members 171 and 173 will be described in detail later.

The inner and outer actuating members 171 and 173 are not limited to the above-described three layer structure and may simply include only the metal layers 207*b* so as to perform original functions of electrodes. In this case, an additional insulating layer may be formed above the first and second immovable electrodes 131 and 133 to insulate the inner and outer actuating members 171 and 173 from the first and second immovable electrodes 131 and 133.

Each of the inner and outer actuating members 171 and 173 may include two layers, i.e., the first layer 207*a* and the metal layer 207*b*. In this case, the additional insulating layer does not need to be formed above the first and second immovable electrodes 131 and 133.

The first and second contacting members 179*a* and 179*b* are provided at both sides of a lower surface of the outer actuating member 173. The first and second contacting members 179*a* and 179*b* respectively face the first and second pushing rods 177*a* and 177*b* to effectively receive pushing forces from the first and second pushing rods 177*a* and 177*b* so as to improve the contacting forces. Thus, an insertion loss can be reduced.

The operation of the MEMS switch having the above-described structure will now be described in brief.

Figure 4B:
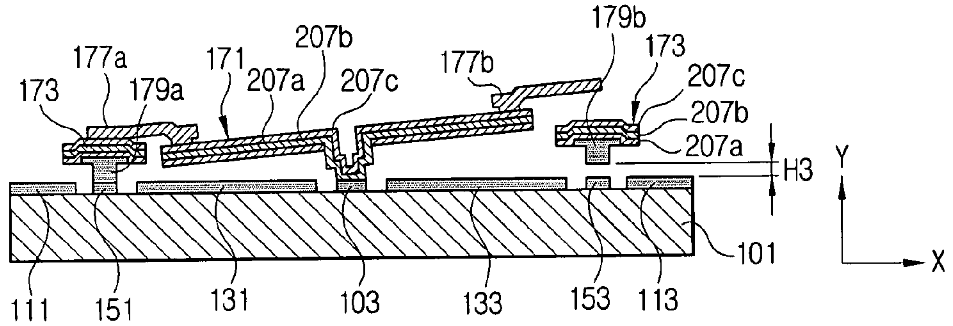
Figure 4C:
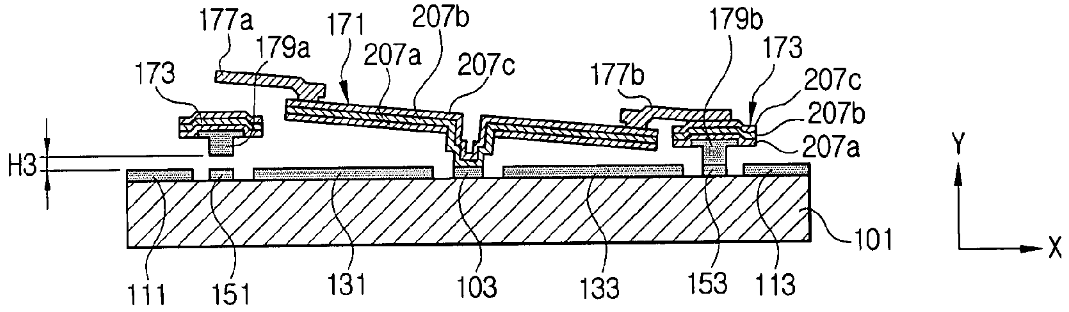

FIGS. 4A through 4C are cross-sectional views taken along line III-III' shown in FIG. 3 to illustrate the operation of the MEMS switch shown in FIG. 1.

Referring to FIG. 4A, in an initial state in that voltages are not applied to the first and second immovable electrodes 131 and 133, the inner and outer actuating members 171 and 173 are in a horizontal state so as to keep the predetermined gap H1 from the substrate 101.

Referring to FIGS. 3 and 4B, when a predetermined voltage is applied to the first immovable electrode 131, static electricity is charged between the first immovable electrode 131 and the inner actuating member 171 above the first immovable electrode 131. Also, the inner actuating member 171 is pulled toward the substrate 101 by an electrostatic force. Thus, the first pushing rod 177*a* formed on the inner actuating member 171 pushes an upper surface of the outer actuating member 173, and the outer actuating member 173 rotates toward the substrate 101 due to the pushing force of the first pushing rod 177*a*. The first contacting member 179*a* formed on a lower surface of the outer actuating member 173 contacts a first switching contact point 151*a* of a first signal line 151 so as to be connected to the first signal line 151. Here, the first pushing rod 177*a* directly pushes a portion of the outer actuating member 173 beneath which the first contacting member 179*a* is positioned, so as to improve the contacting force of the first contacting member 179*a*. Thus, a contacting resistance is reduced, and an insertion loss of the first signal line 151.

Referring to FIGS. 3 and 4C, when a drive voltage is applied to the second immovable electrode 133, static electricity is charged between the second immovable electrode 133 and the inner actuating member 171 facing the second immovable electrode 133. Also, the second contacting member 179*b* contacts the second switching contact point 153*a* so as to be connected to a second signal line 153 according to the contact principle of the first contacting member 179*a* with the first switching contact point 151*a*.

Here, although a stiction occurs at the first contacting member 179*a*, the stiction may be easily overcome by driving the inner actuating member 171. In other words, the first pushing rod 177*a* is formed of an insulating material, and an upper layer of the outer actuating member 173 is formed of the first insulating layer 207*a*. Thus, a stiction does not occur between the first pushing rod 177*a* and the outer actuating member 173. As a result, an area in which the stiction occurs is restricted to the outer actuating member 177 not to the electrode area of the inner actuating member 171. However, since the electrode area of the outer actuating member 177 is small, the stiction occurring at the first contacting member 179*a* can be easily solved only by a drive force of the inner actuating member 171 driven to switch the second switching contact point 153.

The second spring arm 175*b* may be designed to be stiff so as to obtain a great restoring force contributing to solving the stiction. The first spring arm 175*a* is designed to be less stiff so as to enable a low voltage drive.

A process of fabricating the MEMS switch will now be described.

FIGS. 5A through 5M are cross-sectional views taken along line III-III' shown in FIG. 3 to illustrate a process of fabricating the MEMS switch shown in FIG. 1. Here, portions in which the second anchors 105 are formed are not shown.

Figure 5A:
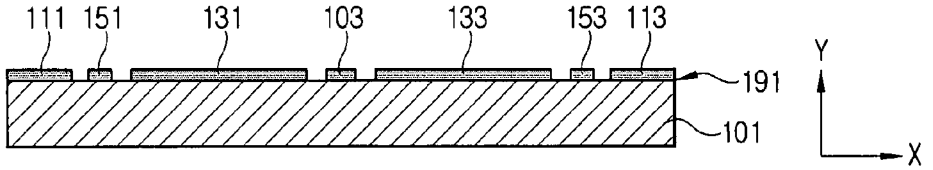
FIGS. 5A through 5M are cross-sectional views taken along line III-III' shown in FIG. 3 to illustrate a process of fabricating the MEMS switch shown in FIG. 1.

Referring to FIGS. 3 and 5A, a metal layer 191, for example, Au, is deposited on the substrate 101, and then the first and second ground electrodes 111 and 113, the first and second immovable electrodes 131 and 133, and the first and second signal lines 151 and 153 are patterned. Here, the first and second signal lines 151 and 153 are patterned so that ends of the first and second signal lines 151 and 153 are shorted so as to form the first and second switching contact points 151*a* and 153*a*. The first and second anchors 103 and 105 are additionally patterned. Here, the first and second anchors 103 and 105 support the inner and outer actuating members 171 and 173 so as to perform the seesaws. The first and second anchors 103 and 105 are formed on the same axis line so as to keep predetermined distances. Such a patterning work may be performed by an etching apparatus, and the etching process may be a dry etching apparatus.

Figure 5B:
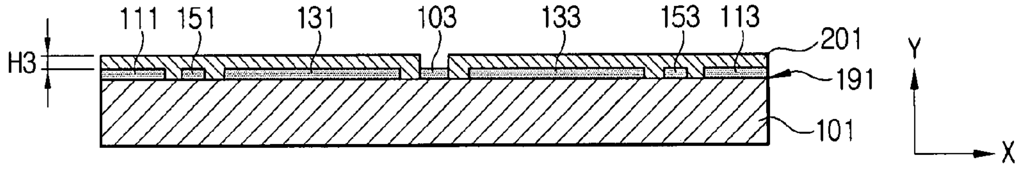

Referring to FIGS. 3 and 5B, a first sacrificial layer 201 is deposited to a predetermined thickness. In other words, the first sacrificial layer 201 is deposited to a thickness enough to keep gaps H3 between the first and second contacting members 179*a* and 179*b* and the first and second signal lines 151 and 153. The first sacrificial layer 201 is deposited by coating a photosensitive material such as photoresist using a spin coater. Here, a portion of the first sacrificial layer 201 covering the first and second anchors 103 and 105 is removed by a photolithography method.

Figure 5C:
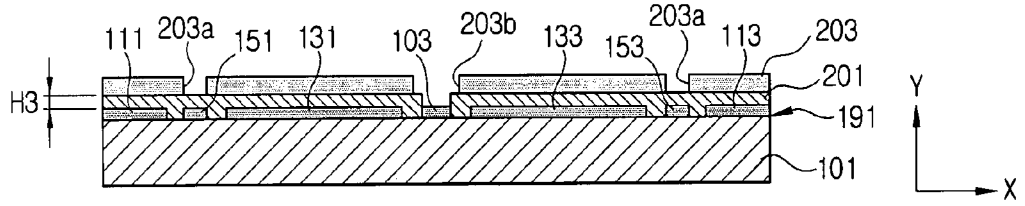

Referring to FIGS. 3 and 5C, a second sacrificial layer 203 is deposited to a predetermined thickness, and contacting member holes 203*a*, in which the first and second contacting members 179*a* and 179*b* are to be formed, are patterned. Here, the contacting member holes 203*a* are also removed by the photolithography method. Anchor holes 203*b* are patterned so as to expose portions in which the first and second anchors 103 and 105 are formed. This is to form the inner and outer actuating members 171 and 173 in a subsequent process so as to directly contact upper surfaces of the first and second anchors 103 and 105.

Figure 5D:
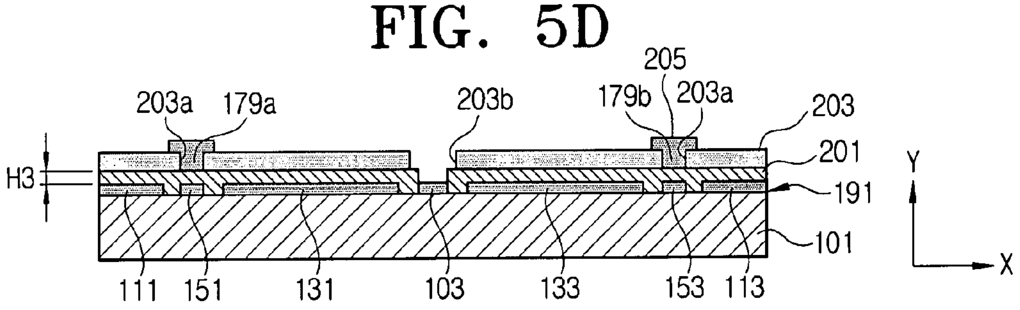
Figure 5E:
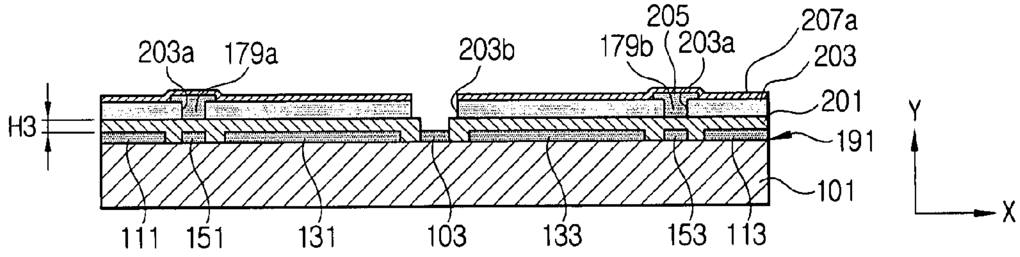
Figure 5F:
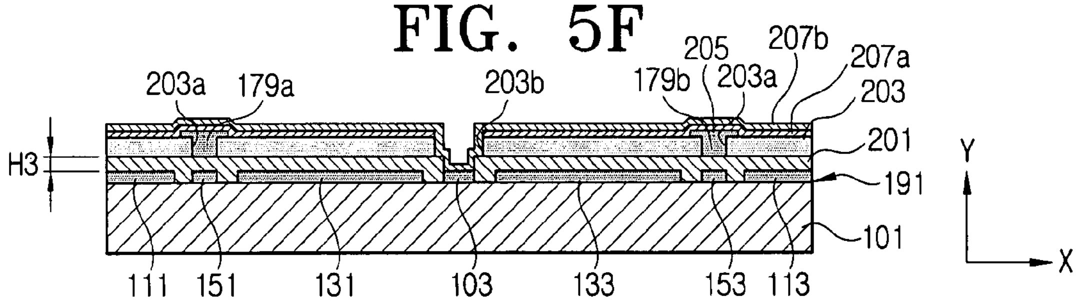
Figure 5G:
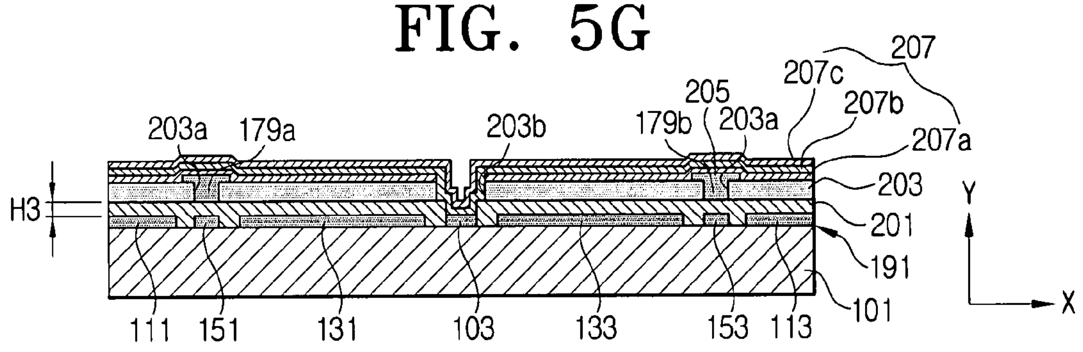

Referring to FIGS. 3 and 5D, a contacting member layer 205 is deposited on the second sacrificial layer 203 and then patterned so that portions of the contacting member layer 205 buried in the contacting member holes 203*a* are left, so as to form the first and second contacting members 179*a* and 179*b*. The contacting member layer 205 is formed of a conductive material, for example, Au.

Referring to FIGS. 3, 5E, 5F, and 5G, the first insulating layers 207*a*, the metal layers 207*b*, and the second insulating layers 207*c* are sequentially stacked on the second sacrificial layer 203 on which portions of the first and second contacting members 179*a* and 179*b* are left to form an actuating member layer 207.

The three layer structure is to reduce a deformation caused by a thermal stress. The actuating member layer 207 is not limited to the three layer structure, but only the metal layers 207*b* may be formed. Here, the additional insulating layer may be deposited before the first sacrificial layer 201 is deposited to insulate the actuating member layer 207 from the first and second immovable electrodes 131 and 133, so as to form the additional insulating layer on the first and second immovable electrodes 131 and 133.

Figure 5H:
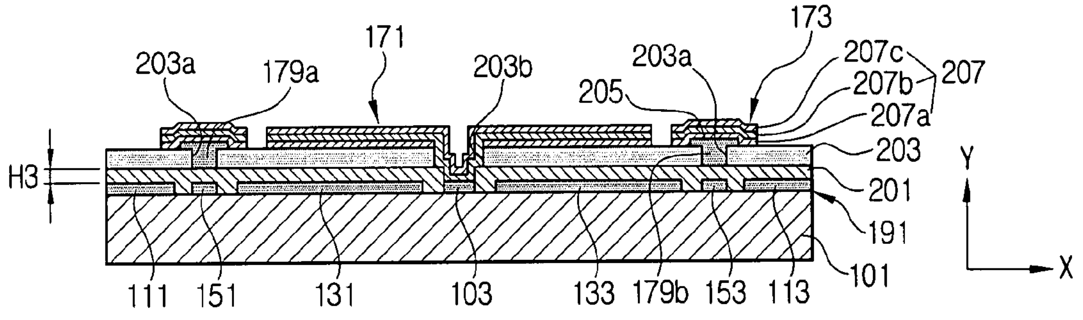

Referring to FIGS. 3 and 5H, the actuating member layer 207 is etched to pattern the inner and outer actuating members 171 and 173. Here, the first spring arm 175*a*, which extends from the first anchor 103 and the both ends of the central portion of the inner actuating member 171, is also patterned. Also, the second spring arms 175*b*, which extend from the second anchors 105 and an outer side of a central portion of the outer actuating member 173, are patterned.

Figure 5I:
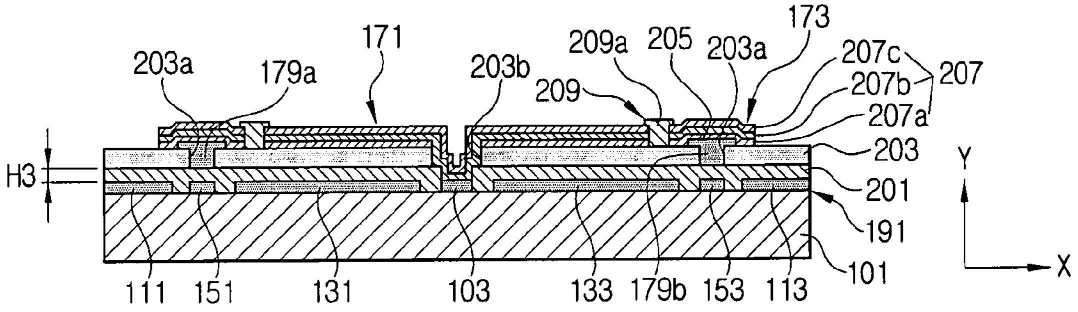

Referring to FIGS. 3 and 5I, a third sacrificial layer 209 is deposited on an actuating member layer 207*a* on which the inner and outer actuating members 171 and 173 are patterned. Gap forming parts 209*a* are patterned so that the first and second pushing rods 179*a* and 179*b* keep predetermined gaps from the upper surface of the outer actuating member 173. Here, the gap forming parts 209*a* are patterned by the photolithography method.

Figure 5J:
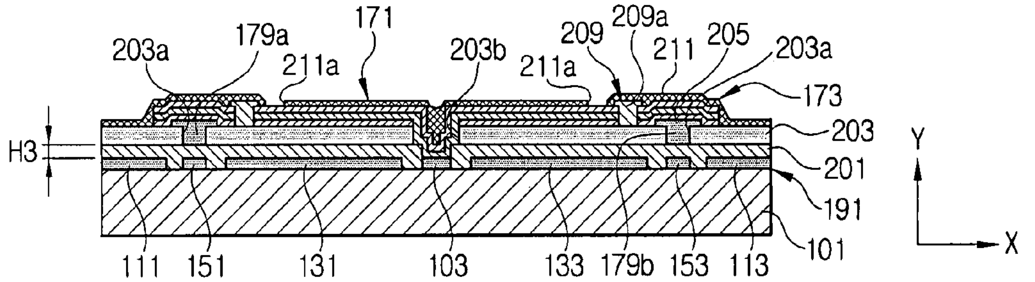

Referring to FIG. 5J, a fourth sacrificial layer 211 is coated on the inner and outer actuating members 171 and 173 on which the gap forming parts 209*a* are formed, and then first and second pushing rod support holes 211*a* are patterned. Here, the first and second pushing rod support holes 211*a* are patterned by the photolithography method.

Figure 5K:
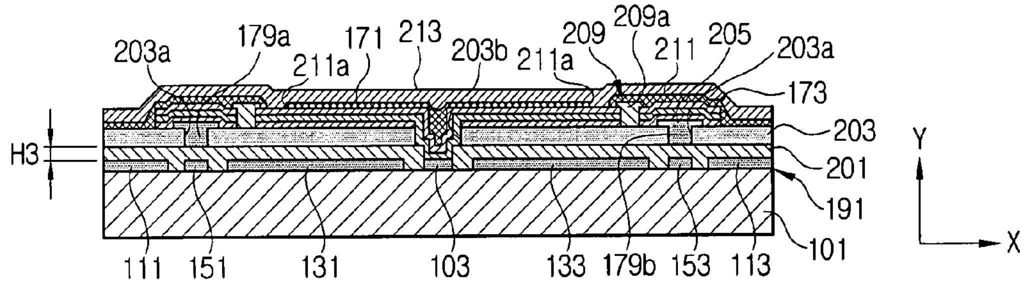
Figure 5L:
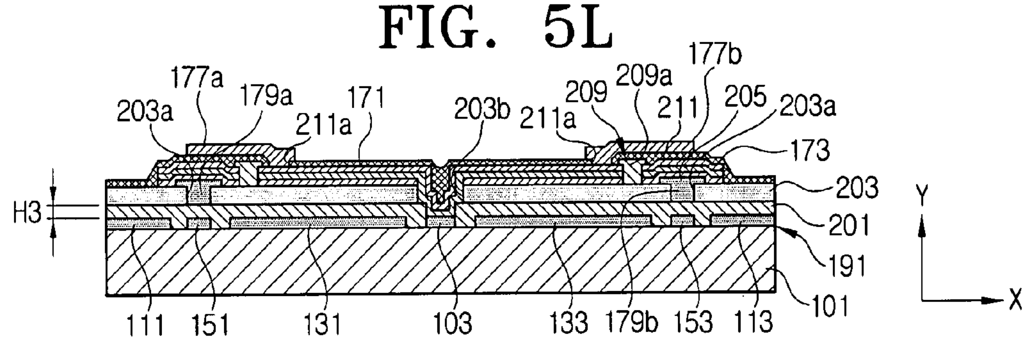

Referring to FIGS. 3, 5K, and 5L, a pushing rod layer 213 is deposited on the fourth sacrificial layer 211 and then etched to pattern the first and second pushing rods 177*a* and 177*b*. Here, the pushing rod layer 213 is formed of an insulating material.

Figure 5M:
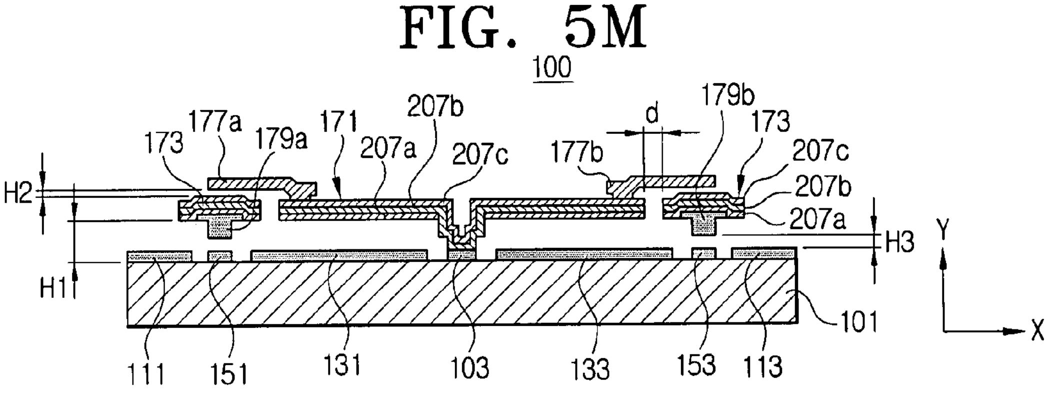

Referring to FIG. 5M, the first, second, third, and fourth sacrificial layers 201, 203, 209, and 211 are removed using an ashing apparatus to complete an MEMS switch 100.

As described above, in an MEMS switch and a method of fabricating the MEMS switch according to an exemplary embodiment of the present invention, an actuating member can include an inner actuating member taking charge of a drive function and an outer actuating member taking charge of a switch contact function. Thus, an occurrence of a stiction fail can be effectively solved.

Also, pushing rods less deforming can be adopted to concentrate pushing forces on a side on which contacting members are provided. Thus, contacting forces of the contacting members can be improved so as to reduce an insertion loss.

In addition, a spring arm can be designed to be less stiff so as to enable a low voltage drive. Also, second spring arms of the outer actuating member taking charge of the switch contact function can be designed to be substantially stiffer. Thus, the occurrence of the stiction fail can be effectively reduced.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method of fabricating a micro electro mechanical system switch, comprising:

depositing a metal layer on a substrate and patterning signal lines comprising switching contact points and immovable electrodes;

depositing a sacrificial layer on the signal lines and the immovable electrodes;

depositing a second sacrificial on the first sacrificial layer and forming contacting member holes in positions facing the switching contact points;

depositing a contacting member layer on the second sacrificial layer and leaving portions of the contacting member layer buried in the contacting member holes to pattern contacting members;

depositing an actuating member layer on an upper surface of the contacting member layer on which the contacting members are formed and patterning inner and outer actuating members;

depositing a third sacrificial layer on the second sacrificial layer on which the inner and outer actuating members are formed and patterning gap forming parts forming gaps of pushing rods;

depositing a fourth sacrificial layer on the third sacrificial layer and patterning pushing rod support holes;

depositing a pushing rod layer on the fourth sacrificial layer and patterning the pushing rods; and removing the first, second, third, and fourth sacrificial layers.

2. The method of claim 1, before depositing the first sacrificial layer on the signal lines and the immovable electrodes, further comprising:

forming an insulating layer on the immovable electrodes to insulate a metal layer from the immovable electrodes, wherein the actuating member layer is deposited using the metal layer.

3. The method of claim 1, wherein the actuating member layer is deposited by sequentially stacking a first insulating layer and a metal layer.

4. The method of claim 1, wherein the actuating member layer is deposited by sequentially stacking a first insulating layer, a metal layer, and a second insulating layer.

5. The method of claim 1, wherein depositing the metal layer on the substrate and patterning the signal lines comprising the switching contact points and the immovable electrodes comprises:

patterning a first anchor supporting the inner actuating member so that the inner actuating member performs a seesaw and second anchors supporting the outer actuating member so that the outer actuating member performs a seesaw.

6. The method of claim 5, wherein the first anchor is formed on an identical axis line to second anchors.

7. The method of claim 6, wherein patterning the inner and outer actuating members comprises:

forming a first spring arm extending at the first anchor from opposite ends of a central portion of the inner actuating member; and forming second spring arms extending at the second anchors from opposite ends of a central portion of the outer actuating member.

8. The method of claim 7, wherein the second spring arms are stiffer than the first spring arm.

9. The method of claim 8, wherein widths of the second spring arms are greater than a width of the first spring arms so as to increase the stiffness of the second spring arms.

10. The method of claim 1, wherein the pushing rod layer is formed of an insulating material.

11. The method of claim 1, wherein the contacting members are formed of gold (Au).

* * * * *